Figure 1:
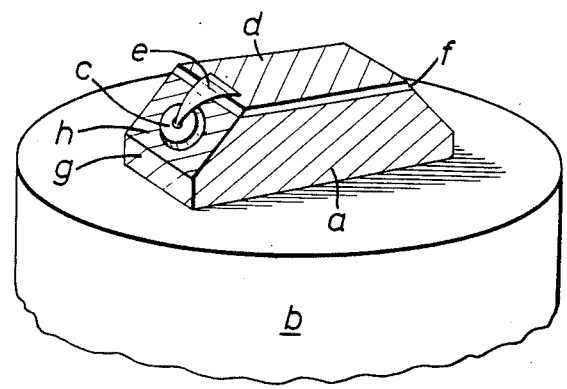

United States Patent [19]

Eaton et al.

[11] Patent Number: 4,582,954
[45] Date of Patent: Apr. 15, 1986

[54] DIAMOND HEATSINK ASSEMBLIES

[75] Inventors: Ralph M. Eaton; Michael W. Geen, both of Northampton, England

[73] Assignee: Plessey Overseas Limited, Ilford, England

[21] Appl. No.: 664,873

[22] Filed: Oct. 25, 1984

[30] Foreign Application Priority Data

Oct. 26, 1983 [GB] United Kingdom ............... 8328573

[51] Int. Cl.[4] ........................ H01L 23/36; H05K 7/20
[52] U.S. Cl. ................................ 174/16 HS; 357/81; 361/388
[58] Field of Search .................... 174/16 HS; 361/386, 361/387, 388; 357/81; 165/80 B, 185

[56] References Cited

U.S. PATENT DOCUMENTS

| 3,678,995 | 7/1972 | Collard | 174/16 HS X |
| 3,721,289 | 3/1973 | Seal | 174/16 HS X |
| 3,828,848 | 8/1974 | Custers et al. | 361/388 X |
| 3,872,496 | 3/1975 | Potter | 357/81 |

FOREIGN PATENT DOCUMENTS

| 0019003 | 6/1980 | European Pat. Off. |  |
| 60861 | 4/1982 | Japan | 357/81 |
| 1278015 | 6/1972 | United Kingdom. |  |
| 1393934 | 5/1975 | United Kingdom. |  |
| 2109995 | 6/1983 | United Kingdom. |  |
| 855793 | 8/1981 | U.S.S.R. | 357/81 |

OTHER PUBLICATIONS

Dyment, J. C. et al.; Continuous Operation of GaAs Junctions Lasers on Diamond Heat Sinks at 200° K.; Applied Physics Letters; Nov. 1, 1967; Vol. II, No. 9, p. 292.

Nagao, Hiroyuki et al.; Silicon Impatt Diode Device Incorporating a Diamond Heat Sink; NEC Research & Development No. 35, Oct. 1974.

Primary Examiner—A. T. Grimley
Assistant Examiner—Morris H. Nimmo
Attorney, Agent, or Firm—Fleit, Jacobson, Cohn & Price

[57] ABSTRACT

A diamond heatsink assembly includes a multifaceted diamond mounted on a metal heatsink. The diamond may be partially embedded in the metal heatsink by pressing, soldering or clamping or the metal heatsink may comprise a split collet arrangement so that the diamond is removable. An electronic component such as a multimetric or a micrometric wave device can be mounted on one or several facets, and a faulty component can be removed and a new one secured to the same or another facet.

6 Claims, 6 Drawing Figures

DIAMOND HEATSINK ASSEMBLIES

This invention relates to diamond heatsink assemblies which are particularly suitable for mounting small electronic devices thereon which emit a fair degree of heat when in operation.

It is known to provide a diamond as a heatsink for such devices since the thermal conductivity of a diamond mounted on a suitable metal member of high thermal conductivity is at least twice that of a metal member without the diamond. The metal member usually comprises a threaded stud of gold, silver or copper with the diamond pressed into the end or the diamond may be mounted on top of the stud by soldering, brazing or welding. The stud is adapted to be screwed into a base or wall member until the end of the stud is substantially aligned with the surface of the base or wall member with the electronic device mounted centrally on the diamond. The electronic device may, for example project into a waveguide.

One problem with this arrangement is that if the electronic device becomes faulty the threaded stud must be removed and the assembly completely replaced.

It is an object of the present invention therefore to provide a diamond heatsink assembly which will overcome this problem.

According to the present invention a diamond heatsink assembly comprises a multi-faceted diamond supported on heat sink means, at least a number of the facets being adapted to support an electronic device.

Thus the diamond may be partially embedded in a metal heatsink by pressing, soldering or clamping. The metal heatsink may comprise a split collect arrangement whereby the diamond is readily removable.

Preferably the diamond has a metallic coating which forms the bias bondng stud/R.F. circuit connection for the electronic device. To minimise parasitic impedances and provide a minimal size R.F. circuit contact at least one break may be left across the diamond in the metallic coating to eliminate the need for insulating rings or stand-offs.

Figure 2:
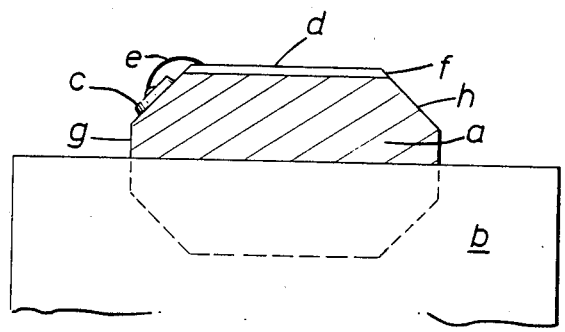
Figure 4:
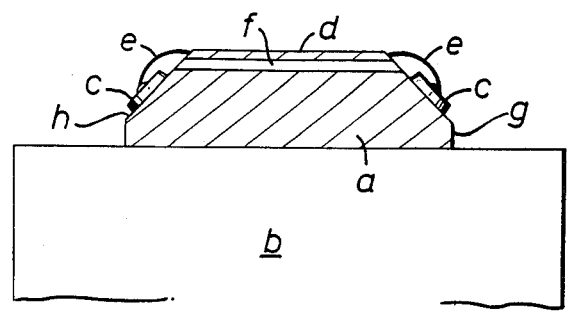
Figure 5:
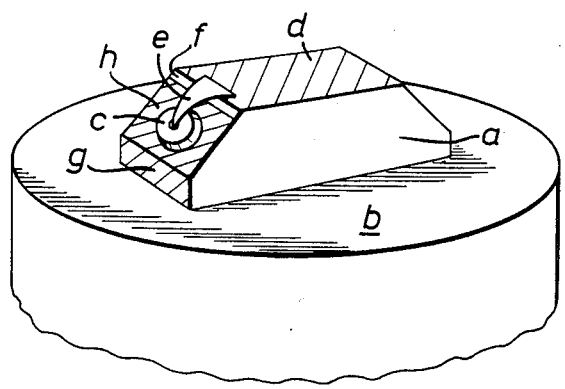
Figure 6:
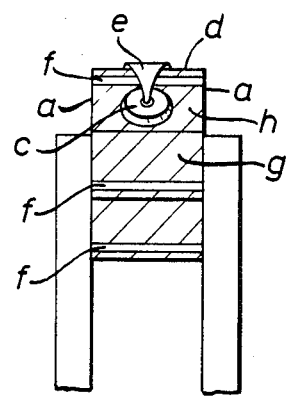

Embodiments of the invention will now be described by way of example only with reference to the accompanying drawings in which FIG. 1 is a perspective view of a diamond heatsink assembly according to the invention, FIG. 2 is a cross-sectional view through the assembly illustrated in FIG. 1, FIGS. 3, 4 and 5 show similar, slightly modified versions of the assembly and FIG. 6 shows a multi-faceted diamond supported in a split collet arrangement.

A semiconductor device c is mounted on a polished or lapped face of a metallised Type IIA diamond, a, which is large enough to allow the dissipated heat to spread to a larger area before reaching a metal heatsink b. The diamond has a metallised face d, parallel to the heatsink face, whilst the semiconductor device lies between the face d and the heatsink b so that RF circuit contact may be made to the semiconductor through face d and bond wire(s) or tape(s) e, without touching the semiconductor device, thereby providing some mechanical protection to the device as well as excellent heatsinking. It is necessary to provide a d.c. break f in the metallisation.

Figure 3:
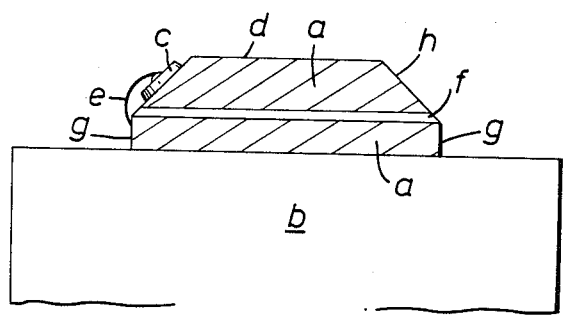

The d.c. break f may be above the semiconductor device, as in FIG. 1 or below it an in FIG. 3 (thereby effectively inverting the polarity of the device). In either case the d.c. break f is traversed by the bond wire or tape e. The wire or tape may be bonded from the top of the semiconductor device to a side face g, angled face h, or top face (as in FIG. 1) of the diamond or to the metal heatsink b itself.

The metallised diamond is pressed, soldered, welded or clamped into the heatsink b.

Two or more devices may be mounted together on the diamond as shown in FIG. 4. These may be in series or parallel, as shown, or a combination of series and parallel.

The package described allows the use of low parasitic impedances because of short bond wires e providing an inductance of typically 20–30 pH and a controllable shunt capacitance by adjusting the height and area of metallised face d. The capacitance can be as low as 0.01 pF, see FIG. 5. The respective impedances for a quartz stand-off or ring arrangement are no better than 0.1 pF and 30–40 pH. The package permits easier circuit matching because it launches into a single well defined central contact d, unlike the distributed contact formed by quartz or ceramic rings or stand-offs which stand outside the device. This package therefore should be suitable for use with higher power millimetric wave devices of small area.

The diamond shown in FIGS. 1 to 4 is typically of octagonal cross section with two large parallel faces. The principle described however may be applied to other shapes, e.g. square, hexagonal or any convenient shape with a top face and lapped or polished sides or angled faces onto which semiconductor devices may be mounted. Faces without devices may be left unpolished.

The metallisation is shown all over except for the d.c. break f. It is possible, however to reduce capacitance by using a 'skeleton' or minimum of metallisation as shown in FIG. 5.

Because of the high cost of diamond heatsink packages and high hazard rate for millimetric wave devices, the multi-face facility of this package also allows the re-use of the packages for another semiconductor device when one device has failed, thereby providing substantial cost saving over conventional diamond heatsink arrangements.

FIG. 6 illustrates an arrangement wherein the type IIA diamond a acts as the microwave package in its entirety. A many faceted diamond, each facet a potential site for device bonding, is held rigidly for component bonding. As an example, FIG. 6 shows a 6-sided diamond clamped in a split-collet arrangement h.

A similar arrangement is envisaged to hold the diamond in position in the waveguide. In common with FIGS. 1 to 5, stand-offs would not necessarily be required; the electrical requirements being satisfied by breaks in the diamond metallisation. In the event of device failure, the diamond could easily by removed from the re-usable clamping structure, the device removed and a new one secured to another facet.

We claim:
1. A diamond heatsink assembly comprising:
a heatsink mounting,
a multi-faceted diamond in thermal contact with the heatsink mounting,
at least a number of the facets of the diamond being inclined to the surface of the mounting and being prepared and flat for each to support an electronic device, at least a portion of said multi-faceted diamond having a metallic layer, at least one electronic device being supported on the surface of one of the inclined facets of the diamond and connected to the metallic layer on the diamond, and said metallic layer including at least one discontinuity providing a dc break between at least one metallized facet of the diamond and said heatsink mounting and said at least one electronic device.

2. A diamond heatsink assembly as claimed in claim 1 in which the diamond is partially embedded in a metal heatsink mounting.

3. A diamond heatsink assembly as claimed in claim 1 in which the diamond is soldered to a metal heatsink mounting.

4. A diamond heatsink assembly as claimed in claim 1 in which the diamond is clamped in a metal heatsink mounting.

5. A diamond heatsink assembly, as claimed in claim 1 in which at least two inclined facets of the diamond each support an electronic device, the electronic devices being electronically interconnected.

6. A diamond heatsink assembly, as claimed in claim 1 in which the diamond has an octagonal cross section when sectioned in a plane normal to the surface of the mounting.

* * * * *